(12) United States Patent
Shinohara et al.

(10) Patent No.: US 11,271,148 B2
(45) Date of Patent: Mar. 8, 2022

(54) DOMAIN WALL TYPE MAGNETIC RECORDING ELEMENT AND MAGNETIC RECORDING ARRAY

(71) Applicant: TDK CORPORATION, Tokyo (JP)

(72) Inventors: Tetsuhito Shinohara, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 83 days.

(21) Appl. No.: 16/643,220

(22) PCT Filed: Oct. 26, 2017

(86) PCT No.: PCT/JP2017/038624
§ 371 (c)(1),
(2) Date: Feb. 28, 2020

(87) PCT Pub. No.: WO2019/082323
PCT Pub. Date: May 2, 2019

(65) Prior Publication Data
US 2020/0194664 A1 Jun. 18, 2020

(51) Int. Cl.
*H01L 43/02* (2006.01)
*H01L 27/22* (2006.01)
(52) U.S. Cl.
CPC ............ *H01L 43/02* (2013.01); *H01L 27/228* (2013.01)
(58) Field of Classification Search
CPC .............................. H01L 43/02; H01L 27/228
See application file for complete search history.

(56) References Cited

U.S. PATENT DOCUMENTS

2011/0129691 A1* 6/2011 Ishiwata ............. G11C 11/1675
428/828

FOREIGN PATENT DOCUMENTS

| JP | 2009-200123 A | 9/2009 |
| JP | 5441005 B2 | 3/2014 |
| WO | 2009/101827 A1 | 8/2009 |
| WO | 2016/182085 A1 | 11/2016 |

OTHER PUBLICATIONS

Jan. 9, 2018 International Search Report issued in International Patent Application No. PCT/JP2017/038624.

* cited by examiner

*Primary Examiner* — Marc Anthony Armand
(74) *Attorney, Agent, or Firm* — Oliff PLC

(57) ABSTRACT

A domain wall type magnetic recording element includes a first ferromagnetic layer containing a ferromagnetic material, a magnetic recording layer extending in a first direction which intersects a lamination direction of the first ferromagnetic layer and containing a magnetic domain wall, and a nonmagnetic layer sandwiched between the first ferromagnetic layer and the magnetic recording layer, in which the magnetic recording layer includes a recessed part or a protruding part, which is configured to trap the magnetic domain wall, on a side surface, and a width of the first ferromagnetic layer is smaller than a smallest width of the magnetic recording layer in a second direction perpendicular to the first direction in a plan view from the lamination direction.

11 Claims, 12 Drawing Sheets

DOMAIN WALL TYPE MAGNETIC RECORDING ELEMENT AND MAGNETIC RECORDING ARRAY

TECHNICAL FIELD

The present invention relates to a domain wall type magnetic recording element and a magnetic recording array.

BACKGROUND ART

As a next-generation non-volatile memory that will replace a flash memory or the like in which limits on miniaturization have been seen, attention has been focused on resistance change type magnetic recording devices that store data using a resistance change type element. Examples of magnetic recording devices include magnetoresistive random access memories (MRAMs), resistance random access memories (ReRAMs), phase change random access memories (PCRAMs), or the like.

As a method for increasing a density (increasing a capacity) of a memory, there is a method of recording multivalued bits in each element constituting the memory in addition to a method of downsizing the element itself constituting the memory.

Patent Document 1 describes a domain wall type magnetic recording element capable of recording multivalued data by displacing a magnetic domain wall in a magnetic recording layer.

PRIOR ART LITERATURE

Patent Document

[Patent Document 1] PCT International Publication No. WO 2009/101827

SUMMARY OF INVENTION

Technical Problem

In the domain wall type magnetic recording element described in Patent Document 1, a position of a magnetic domain wall is controlled by providing irregularities on a side surface of a magnetic material as a trap site of the magnetic domain wall. However, when a non-uniform shape such as irregularities is provided on the side surface of the magnetic material, there have been cases in which noise occurs in data read from the domain wall type magnetic recording element (in resistance value of the domain wall type magnetic recording element).

The present invention has been made in view of the above-described problems, and it is an objective of the present invention to provide a domain wall type magnetic recording element and a magnetic recording array in which data can be stabilized.

Solution to Problem (1) A domain wall type magnetic recording element according to a first aspect includes a first ferromagnetic layer containing a ferromagnetic material, a magnetic recording layer extending in a first direction which intersects a lamination direction of the first ferromagnetic layer and containing a magnetic domain wall, and a nonmagnetic layer sandwiched between the first ferromagnetic layer and the magnetic recording layer, in which the magnetic recording layer includes a recessed part or a protruding part, which is configured to trap the magnetic domain wall, on a side surface, and a width of the first ferromagnetic layer is smaller than a smallest width of the magnetic recording layer in a second direction perpendicular to the first direction in a plan view from the lamination direction.

(2) In the domain wall type magnetic recording element according to the above-described aspect, the shape of the first ferromagnetic layer in a plan view from the lamination direction may be rectangular.

(3) In the domain wall type magnetic recording element according to the above-described aspect, the first ferromagnetic layer may include a recessed part or a protruding part on a side surface.

(4) In the domain wall type magnetic recording element according to the above-described aspect, a position of the recessed part or the protruding part of the magnetic recording layer in the first direction may align with a position of the recessed part or the protruding part of the first ferromagnetic layer in the first direction.

(5) In the domain wall type magnetic recording element according to the above-described aspect, a first side in the first direction of the magnetic recording layer and a second side in the first direction of the first ferromagnetic layer closest to the first side may be parallel to each other in a plan view from the lamination direction.

(6) In the domain wall type magnetic recording element according to the above-described aspect, a first portion of the magnetic recording layer which does not overlap the first ferromagnetic layer in a plan view from the lamination direction may include a thin part having a thickness smaller than a thickness in the lamination direction of the magnetic recording layer at a position at which a width in the second direction is the smallest, and the thin part may be at a position at which a width in the second direction of the magnetic recording layer is the largest.

(7) In the domain wall type magnetic recording element according to the above-described aspect, in the first portion of the magnetic recording layer which does not overlap the first ferromagnetic layer in a plan view from the lamination direction, a thickness d1 in the lamination direction at a position at which the width in the second direction of the magnetic recording layer is the smallest may be larger than a thickness d2 in the lamination direction at a position at which the width in the second direction of the magnetic recording layer is the largest.

(8) In the domain wall type magnetic recording element according to the above-described aspect, axes of easy magnetization of the first ferromagnetic layer and the magnetic recording layer may be in the lamination direction.

(9) In the domain wall type magnetic recording element according to the above-described aspect, axes of easy magnetization of the first ferromagnetic layer and the magnetic recording layer may be in an in-plane direction perpendicular to the lamination direction.

(10) In the domain wall type magnetic recording element according to the above-described aspect, the number of recessed parts or protruding parts on the side surface of the magnetic recording layer may be 10 or more.

(11) In the domain wall type magnetic recording element according to the above-described aspect, a second ferromagnetic layer reflecting a magnetization state of the magnetic recording layer may be provided between the magnetic recording layer and the nonmagnetic layer.

(12) A magnetic recording array according to a second aspect includes a plurality of domain wall type magnetic recording elements according to the above-described aspect.

Advantageous Effects of Invention

According to the domain wall type magnetic recording element according to the above-described aspects, a range of usable magnetoresistance can be maximized, and each analog value can be increased. Thereby, the read data can be stabilized.

DESCRIPTION OF EMBODIMENTS

Figure 1:
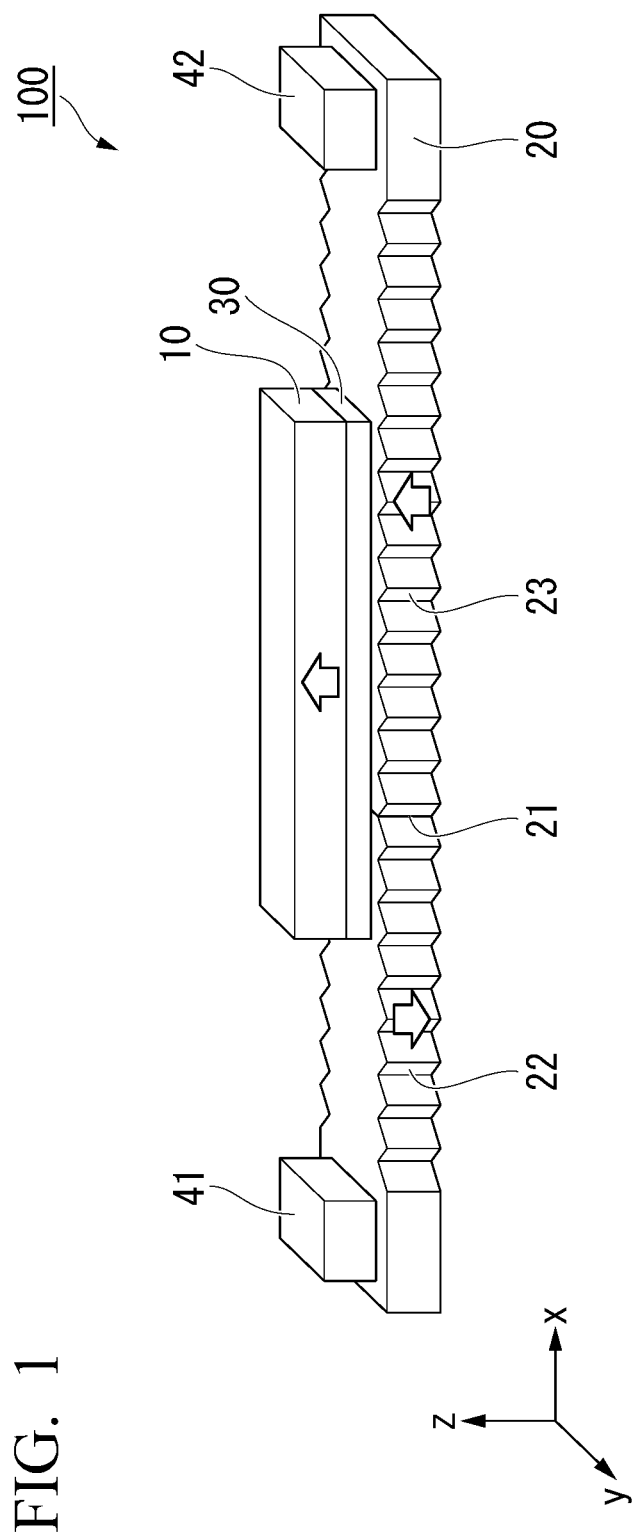
FIG. 1 is a perspective view schematically illustrating a domain wall type magnetic recording element according to a first embodiment.

Hereinafter, the present embodiment will be described in detail with reference to the drawings as appropriate. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like illustrated in the following description are merely examples, and the present invention is not limited thereto and can be implemented with appropriate modifications within a range in which the effects of the present invention are achieved.

(Domain Wall Type Magnetic Recording Element)

First Embodiment

Figure 2:
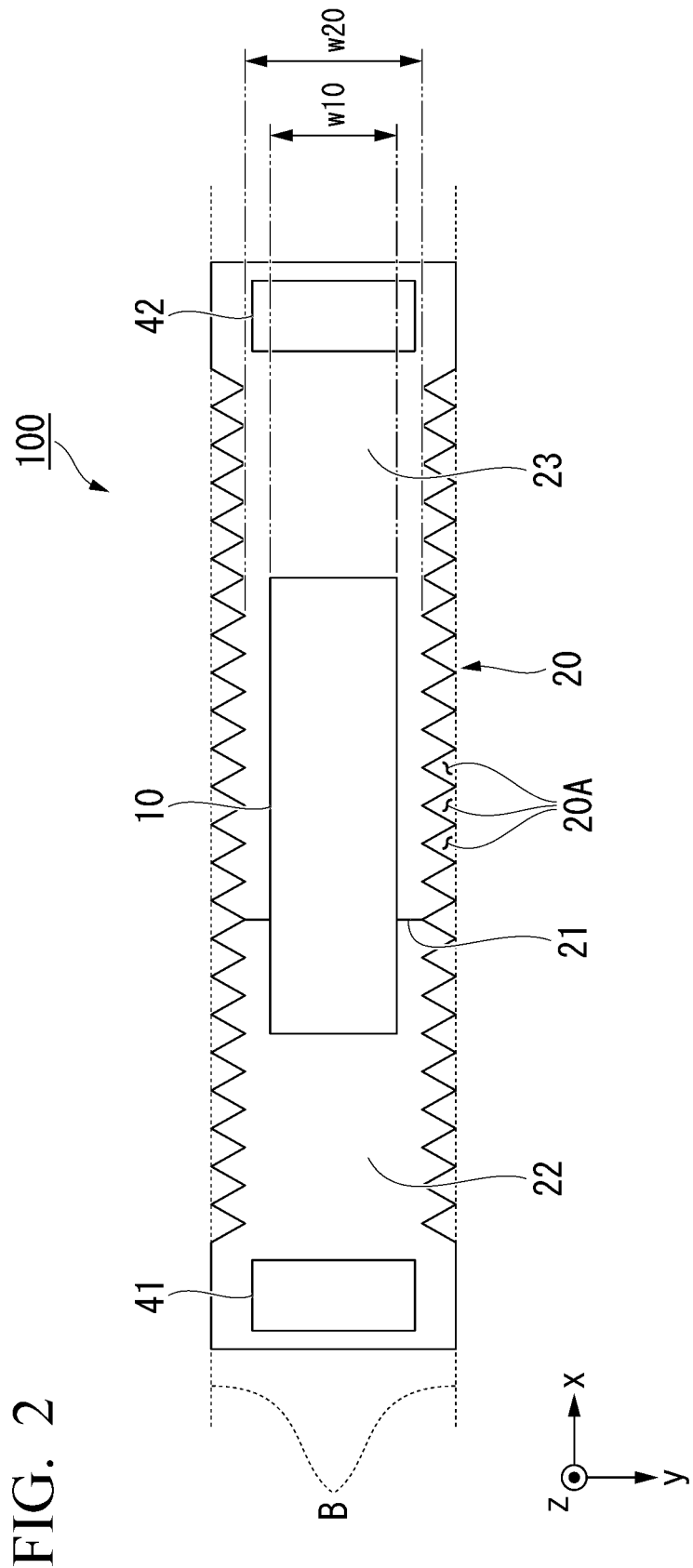
FIG. 2 is a plan view schematically illustrating the domain wall type magnetic recording element according to the first embodiment.

FIG. 1 is a perspective view schematically illustrating a domain wall type magnetic recording element 100 according to a first embodiment. FIG. 2 is a plan view schematically illustrating the domain wall type magnetic recording element 100 according to the first embodiment. The domain wall type magnetic recording element 100 includes a first ferromagnetic layer 10, a magnetic recording layer 20, and a nonmagnetic layer 30. The domain wall type magnetic recording element 100 illustrated in FIG. 1 includes a first electrode 41 and a second electrode 42 at positions sandwiching the first ferromagnetic layer 10 in a plan view.

Hereinafter, a first direction in which the magnetic recording layer 20 extends is referred to as an x direction, a second direction perpendicular to the x direction in a plane in which the magnetic recording layer 20 extends is referred to as a y direction, and a direction perpendicular to the x direction and the y direction is referred to as a z direction. A lamination direction of the domain wall type magnetic recording element 100 illustrated in FIG. 1 aligns with the z direction.

<First Ferromagnetic Layer>

The first ferromagnetic layer 10 illustrated in FIG. 1 has a rectangular shape in a plan view from the z direction and has a rectangular parallelepiped shape in which a width and a length in a thickness direction are constant.

The first ferromagnetic layer 10 contains a ferromagnetic material. As the ferromagnetic material constituting the first ferromagnetic layer 10, for example, a metal selected from the group consisting of Cr, Mn, Co, Fe and Ni, an alloy containing one or more of these metals, and an alloy containing these metals and at least one of the elements B, C, and N, or the like can be used. Specifically, Co—Fe, Co—Fe—B, Ni—Fe can be exemplified.

A material constituting the first ferromagnetic layer 10 may be a Heusler alloy. A Heusler alloy is a half metal and has a high spin polarization. The Heusler alloy is an intermetallic compound having a chemical composition of $X_2YZ$, in which X indicates a transition metal element of the Co, Fe, Ni, or Cu group, or a noble metal element in the periodic table, Y indicates a transition metal of the Mn, V, Cr, or Ti group, or types of the X element, and Z indicates a typical element from Group III to Group V. As the Heusler alloy, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like can be exemplified.

When an axis of easy magnetization of the first ferromagnetic layer 10 is oriented in the z direction (formed as a perpendicular magnetization film) a film thickness of the first ferromagnetic layer 10 is preferably 1.5 nm or less, and more preferably 1.0 nm or less. When the thickness of the first ferromagnetic layer 10 is made thin, perpendicular magnetic anisotropy (interface perpendicular magnetic anisotropy) can be applied to the first ferromagnetic layer 10 at an interface between the first ferromagnetic layer 10 and another layer (the nonmagnetic layer 30). That is, a magnetization direction of the first ferromagnetic layer 10 can be set in the z direction.

<Magnetic Recording Layer>

The magnetic recording layer 20 extends in the x direction. The magnetic recording layer 20 includes a magnetic domain wall 21 inside. The magnetic domain wall 21 is a boundary between a first magnetic domain 22 and a second magnetic domain 23 which have magnetizations in opposite directions from each other. In the domain wall type magnetic recording element 100 illustrated in FIG. 1, the first magnetic domain 22 has a magnetization oriented in the −z direction, and the second magnetic domain 23 has a magnetization oriented in the +z direction.

The domain wall type magnetic recording element 100 records multivalued data according to a position of the magnetic domain wall 21 of the magnetic recording layer 20. Data recorded in the magnetic recording layer 20 is read as a change in resistance value in the lamination direction of the first ferromagnetic layer 10 and the magnetic recording layer 20. When the magnetic domain wall 21 is displaced, a ratio between the first magnetic domain 22 and the second magnetic domain 23 in the magnetic recording layer 20 changes. A magnetization of the first ferromagnetic layer 10 is in an opposite direction (antiparallel) to a magnetization of the first magnetic domain 22 and is in the same direction (parallel) as a magnetization of the second magnetic domain 23. When the magnetic domain wall 21 is displaced in the x direction and an area of the first magnetic domain 22 in a portion overlapping the first ferromagnetic layer 10 when viewed from the z direction increases, a resistance value of the domain wall type magnetic recording element 100 increases. In contrast, when the magnetic domain wall 21 is displaced in the −x direction and an area of the second magnetic domain 23 in a portion overlapping the first ferromagnetic layer 10 when viewed from the z direction increases, a resistance value of the domain wall type magnetic recording element 100 decreases.

The magnetic domain wall 21 is displaced when a current is caused to flow in a direction in which the magnetic recording layer 20 extends or an external magnetic field is applied. For example, when a current pulse is applied from the first electrode 41 to the second electrode 42, the first magnetic domain 22 extends in a direction of the second magnetic domain 23, and the magnetic domain wall 21 is displaced in the direction of the second magnetic domain 23. That is, when a direction and intensity of a current flowing through the first electrode 41 and the second electrode 42 are set, a position of the magnetic domain wall 21 is controlled and data is written to the domain wall type magnetic recording element 100.

The magnetic recording layer 20 has a recessed part or a protruding part on a side surface. The number of recessed parts or protruding parts on the side surface of the magnetic recording layer is preferably 10 or more. When the number of recessed parts or protruding parts is 10 or more, multivalued information (decimal system or more) can be recorded in one domain wall type magnetic recording element 100.

The magnetic recording layer 20 of the domain wall type magnetic recording element 100 illustrated in FIG. 2 includes a plurality of recessed parts 20A that are recessed with respect to a reference plane B. In FIG. 2, the reference plane B is a plane crossing over end portions in the ±y direction of the magnetic recording layer 20 and parallel to the x direction. Depending on how the reference plane B is taken, the magnetic recording layer 20 can also be said to have a plurality of protruding parts protruding with respect to the reference plane B. Since the principle of trapping the magnetic domain wall does not change in between the two cases of the magnetic recording layer 20 having the recessed parts and having the protruding parts on the side surface, hereinafter, a case in which the magnetic recording layer 20 has the recessed parts 20A will be described as an example.

In FIG. 2, the plurality of recessed parts 20A trap the magnetic domain wall 21. In the magnetic recording layer 20, the magnetic domain wall 21 stably stays at a place in which a potential distribution sensed by the magnetic domain wall 21 is low. The recessed parts 20A generates a difference in magnetic potential distribution in the magnetic recording layer 20.

When data is read from the domain wall type magnetic recording element 100, a read current is caused to flow from the first ferromagnetic layer 10 toward either the first electrode 41 or the second electrode 42. There are cases in which the read current flows in a direction perpendicular to the magnetic domain wall 21 in the magnetic recording layer 20 and the magnetic domain wall 21 is displaced. When a position of the magnetic domain wall 21 is changed by the read current, data cannot be accurately extracted. When the magnetic domain wall 21 is trapped by the recessed parts 20A, change in the position of the magnetic domain wall 21 (data rewriting) due to the read current can be inhibited.

A smallest width w20 of the magnetic recording layer 20 in the domain wall type magnetic recording element 100 according to the first embodiment is larger than a width w10 of the first ferromagnetic layer 10. That is, the width w10 of the first ferromagnetic layer 10 is smaller than the smallest width w20 of the magnetic recording layer 20. Here, the width w10 and the smallest width w20 mean a width and a smallest width in a projection view projected in the z direction. For example, in a case in which a cross section taken along an yz plane is a trapezoid in which a length of a lower base is larger than a length of an upper base, it means the width of a lower surface of the trapezoid.

When the smallest width w20 of the magnetic recording layer 20 is larger than the width w10 of the first ferromagnetic layer 10, the recessed parts 20A and the first ferromagnetic layer 10 do not overlap in a plan view from the z direction. A magnetoresistance (MR) ratio of the domain wall type magnetic recording element 100 is generated by a change in a magnetization state of two magnetic materials (the first ferromagnetic layer 10 and the magnetic recording layer 20) sandwiching the nonmagnetic layer 30. That is, a large MR ratio can be obtained when a magnetization state of a portion of the magnetic recording layer 20 overlapping the first ferromagnetic layer 10 in a plan view from the z direction is stable.

A magnetization in the vicinity of the recessed parts 20A of the magnetic recording layer 20 is affected by interface (side surface) effects, and a magnetization state thereof is disturbed. When the recessed parts 20A and the first ferromagnetic layer 10 overlap in a plan view from the z direction, the magnetization state disturbed by the recessed parts 20A causes noise, and an MR ratio of the domain wall type magnetic recording element 100 is lowered. In contrast, when the recessed parts 20A and the first ferromagnetic layer 10 do not overlap in a plan view from the z direction, the recessed parts 20A whose magnetization state is disturbed do not affect the MR ratio of the domain wall type magnetic recording element 100.

The magnetic recording layer 20 is made of a magnetic material. The same magnetic material as that of the first ferromagnetic layer 10 can be used as the magnetic material constituting the magnetic recording layer 20. Also, the magnetic recording layer 20 preferably has at least one element selected from the group consisting of Co, Ni, Pt, Pd, Gd, Tb, Mn, Ge, and Ga. For example, a film in which Co and Ni are laminated, a film in which Co and Pt are laminated, a film in which Co and Pd are laminated, an MnGa-based material, a GdCo-based material, and a TbCo-based material can be exemplified. Ferrimagnetic materials such as an MnGa-based material, a GdCo-based material, and a TbCo-based material have a small saturation magnetization and can reduce a threshold current necessary for displacing the magnetic domain wall. Also, a film in which Co and Ni are laminated, a film in which Co and Pt are laminated, and a film in which Co and Pd are laminated have a large coercive force and can reduce a displacement speed of the magnetic domain wall.

<Nonmagnetic Layer>

A known material can be used for the nonmagnetic layer 30.

For example, when the nonmagnetic layer 30 is made of an insulator (in a case of a tunnel barrier layer), $Al_2O_3$, $SiO_2$, MgO, $MgAl_2O_4$, or the like can be used for the material. In addition to these materials, a material in which a part of Al, Si, and Mg is substituted with Zn, Be, or the like can also be used. Of these, since MgO and $MgAl_2O_4$ are materials that can realize coherent tunneling, spin can be efficiently injected. When the nonmagnetic layer 30 is made of a metal, Cu, Au, Ag, or the like can be used as the material. Further, when the nonmagnetic layer 30 is made of a semiconductor, Si, Ge, $CuInSe_2$, $CuGaSe_2$, $Cu(In, Ga)Se_2$, or the like can be used as the material.

As described above, in the domain wall type magnetic recording element 100 according to the first embodiment, the width w10 of the first ferromagnetic layer 10 is smaller than the smallest width w20 of the magnetic recording layer 20 in the y direction. Therefore, the magnetization in the vicinity of the recessed parts 20A whose magnetization state is disturbed affecting change in resistance value (MR ratio) of the domain wall type magnetic recording element 100 can be inhibited. That is, the domain wall type magnetic recording element 100 according to the first embodiment can inhibit generation of noise.

Second Embodiment

Figure 3:
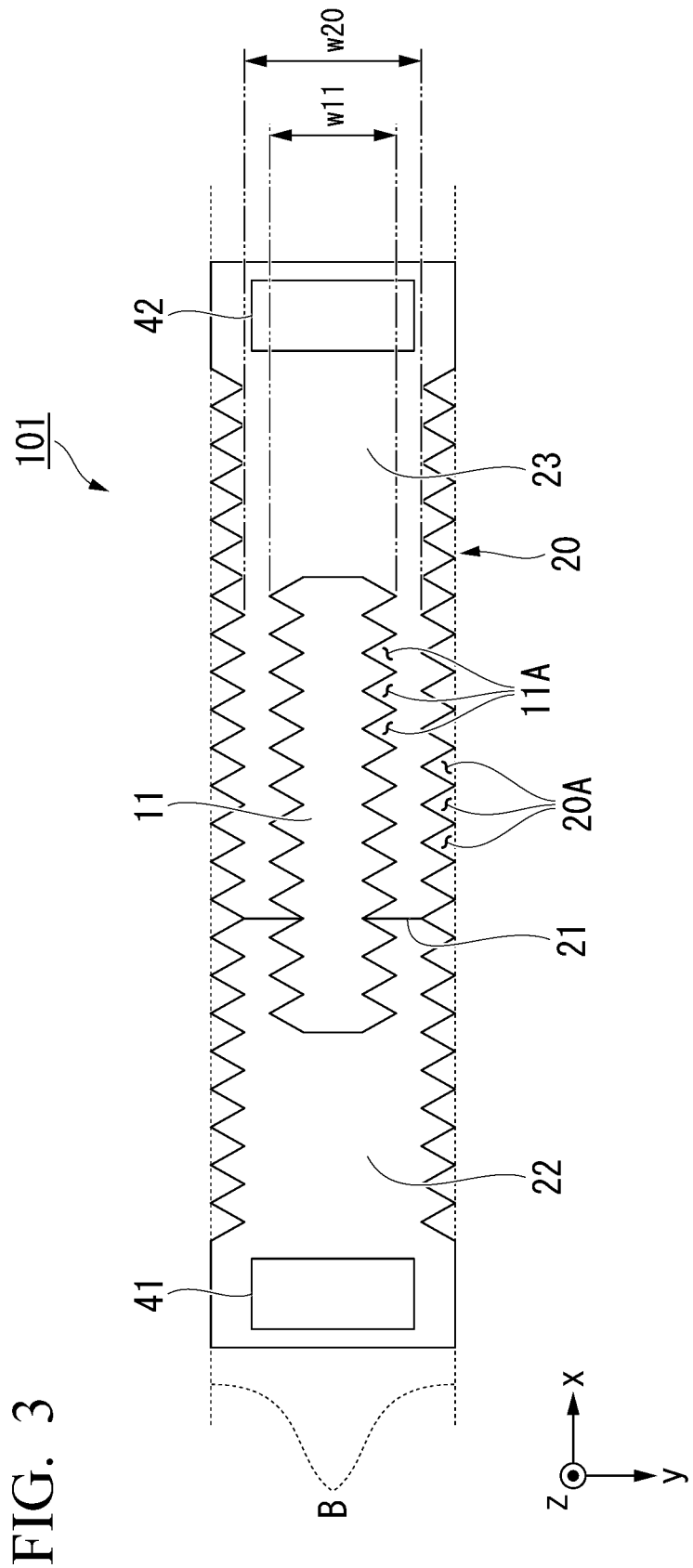
FIG. 3 is a plan view schematically illustrating a domain wall type magnetic recording element according to a second embodiment.

In a domain wall type magnetic recording element 101 according to a second embodiment illustrated in FIG. 3, a first ferromagnetic layer 11 has a plurality of recessed parts 11A on a side surface in a y direction. Depending on where a reference plane is positioned, the first ferromagnetic layer 11 may be regarded as having a plurality protruding parts. The domain wall type magnetic recording element 101 according to the second embodiment differs from the domain wall type magnetic recording element 100 according to the first embodiment in that it has a plurality of recessed parts 11A, and the same constituents will be denoted by the same reference signs, and description thereof will be omitted.

Also in the domain wall type magnetic recording element 101 according to the second embodiment illustrated in FIG. 3, a width w11 of the first ferromagnetic layer 11 is smaller than a smallest width w20 of a magnetic recording layer 20 at any position in the y direction in a plan view from a z direction. That is, a maximum width of the first ferromagnetic layer 11 is smaller than the smallest width w20 of the magnetic recording layer 20.

Figure 4:
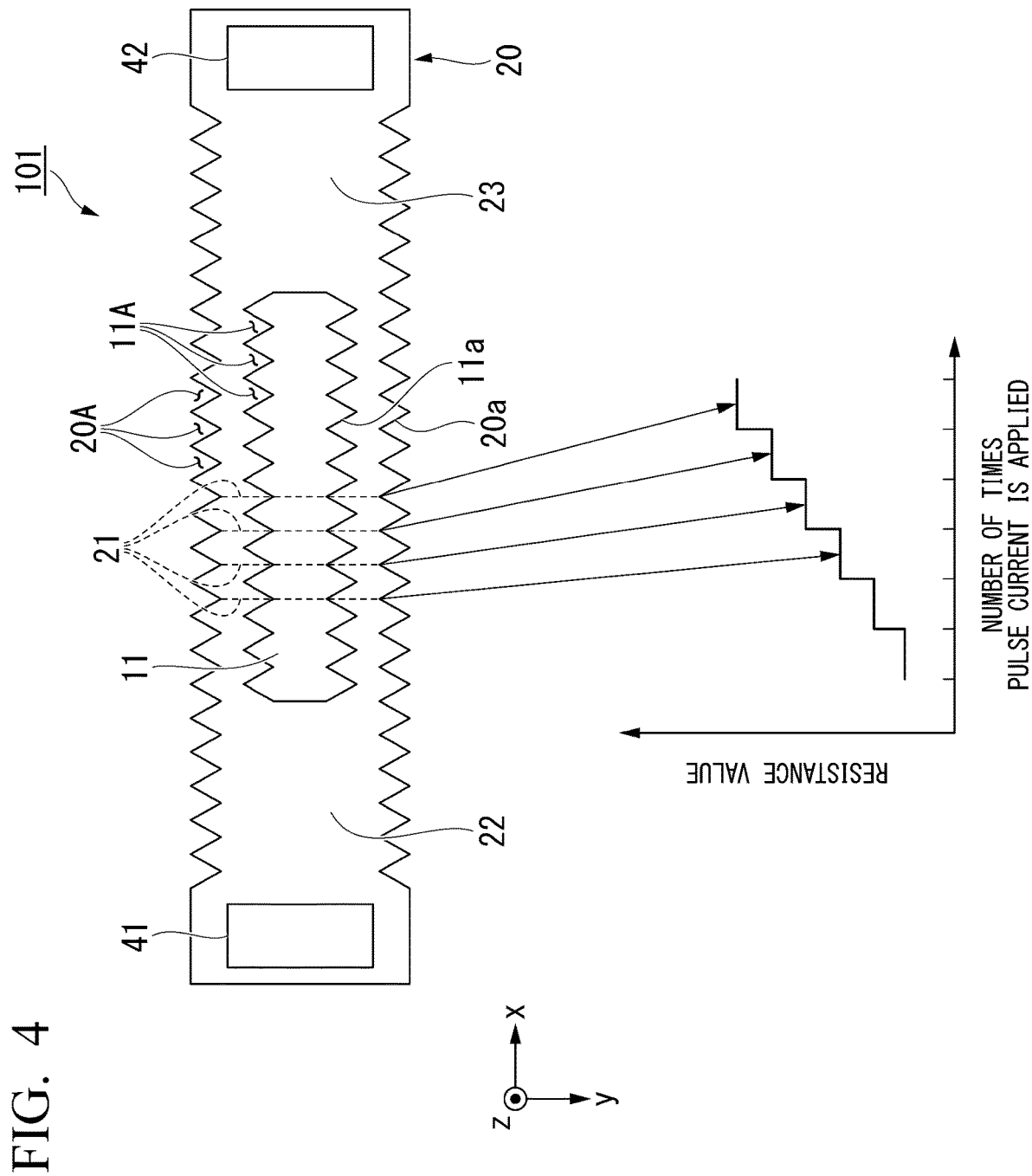
FIG. 4 is a view schematically illustrating change in resistance value of the domain wall type magnetic recording element with respect to a position of a magnetic domain wall.

FIG. 4 is a view schematically illustrating change in resistance value of the domain wall type magnetic recording element 101 with respect to a position of a magnetic domain wall 21. A vertical axis of a graph illustrated in FIG. 4 represents a resistance value in a lamination direction between the first ferromagnetic layer 11 and the magnetic recording layer 20, and a horizontal axis of the graph represents the number of times in which a pulse current is applied from a first electrode 41 toward a second electrode 42. As the number of times the pulse current is applied from the first electrode 41 toward the second electrode 42 increases, the magnetic domain wall 21 is displaced further to a second magnetic domain 23 side.

When the magnetic recording layer 20 has the recessed parts 20A as illustrated in FIG. 4, the change in resistance value of the domain wall type magnetic recording element 101 is exhibited in a stepwise manner. This is because the recessed parts 20A function as trap sites of the magnetic domain wall 21, and displacement of the magnetic domain wall 21 is performed stepwise.

As illustrated in FIGS. 3 and 4, positions of the recessed parts 11A of the first ferromagnetic layer 11 in the x direction preferably align with positions of the recessed parts 20A of the magnetic recording layer 20 in the x direction. When the positions of the recessed parts 11A and the recessed parts 20A in the x direction align with each other, an amount of change in resistance value that changes stepwise is constant (change in height of each step in FIG. 4 is constant). Also, a measured resistance value is a resistance value when the magnetic domain wall 21 is displaced to the recessed parts 20A. Therefore, as illustrated in FIG. 4, an amount of change in measured resistance value is constant, and multivalued data can be stably read.

Also, in a plan view from the z direction, a first side 20a in the x direction of the magnetic recording layer 20 and a second side 11a in the x direction of the first ferromagnetic layer 11 closest to the first side 20a are preferably parallel to each other. When this relationship is satisfied, an amount of change in measured resistance value becomes more constant, and multivalued data can be more stably read.

Figure 5:
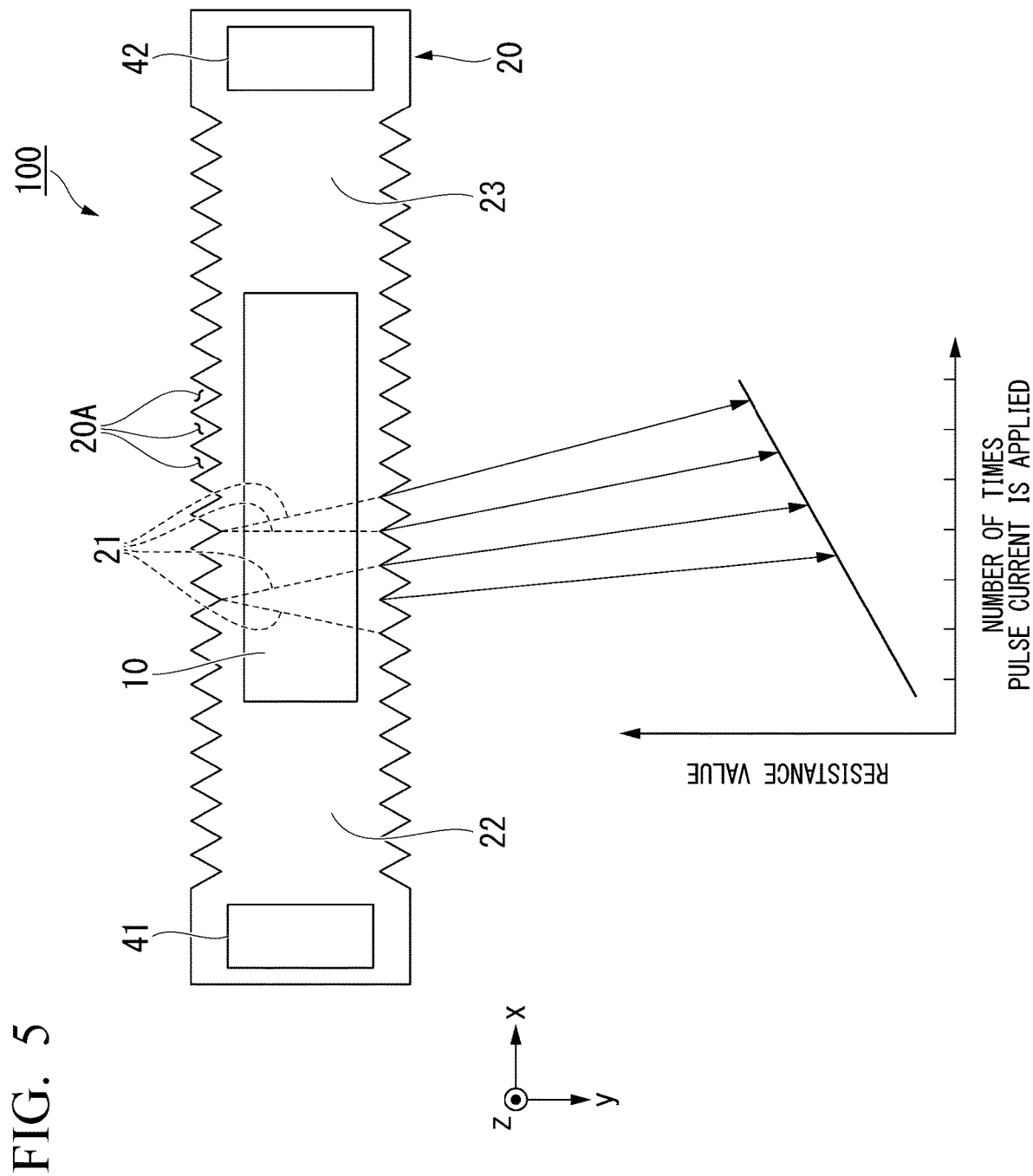
FIG. 5 is a view schematically illustrating change in resistance value of the domain wall type magnetic recording element illustrated in FIG. 2 with respect to a position of the magnetic domain wall.

On the other hand, as in the domain wall type magnetic recording element 100 illustrated in FIG. 2, the first ferromagnetic layer 10 having a rectangular shape in a plan view is suitable when a more continuous (analog) response (change in resistance value) is required. FIG. 5 is a view schematically illustrating change in resistance value of the domain wall type magnetic recording element 100 illustrated in FIG. 2 with respect to a position of the magnetic domain wall 21. A vertical axis of a graph illustrated in FIG. 5 represents a resistance value in a lamination direction between the first ferromagnetic layer 10 and the magnetic recording layer 20, and a horizontal axis of the graph represents the number of times a pulse current is applied from the first electrode 41 toward the second electrode 42.

As illustrated in FIG. 5, when an interval between adjacent recessed parts 20A is small, the magnetic domain wall 21 may be formed to be inclined with respect to the y direction in some cases. In this case, displacement of the magnetic domain wall 21 is stepwise compared to a case in which there is no recessed parts 20A but is continuous compared to a case in which an interval between the recessed parts 20A is sufficiently distant. When a shape of the first ferromagnetic layer 10 in a plan view is rectangular, data can be stably read without needing to consider change in area proportion of the first ferromagnetic layer 10.

As described above, in the domain wall type magnetic recording element 101 according to the second embodiment, a width w10 of the first ferromagnetic layer 10 is smaller than the smallest width w20 of the magnetic recording layer 20 in the y direction. Therefore, the domain wall type magnetic recording element 101 according to the second embodiment can inhibit generation of noise. Also, since the first ferromagnetic layer 11 has the recessed parts 11A corresponding to those in the magnetic recording layer 20, a resistance value that changes stepwise can be stably read.

Third Embodiment

Figure 6:
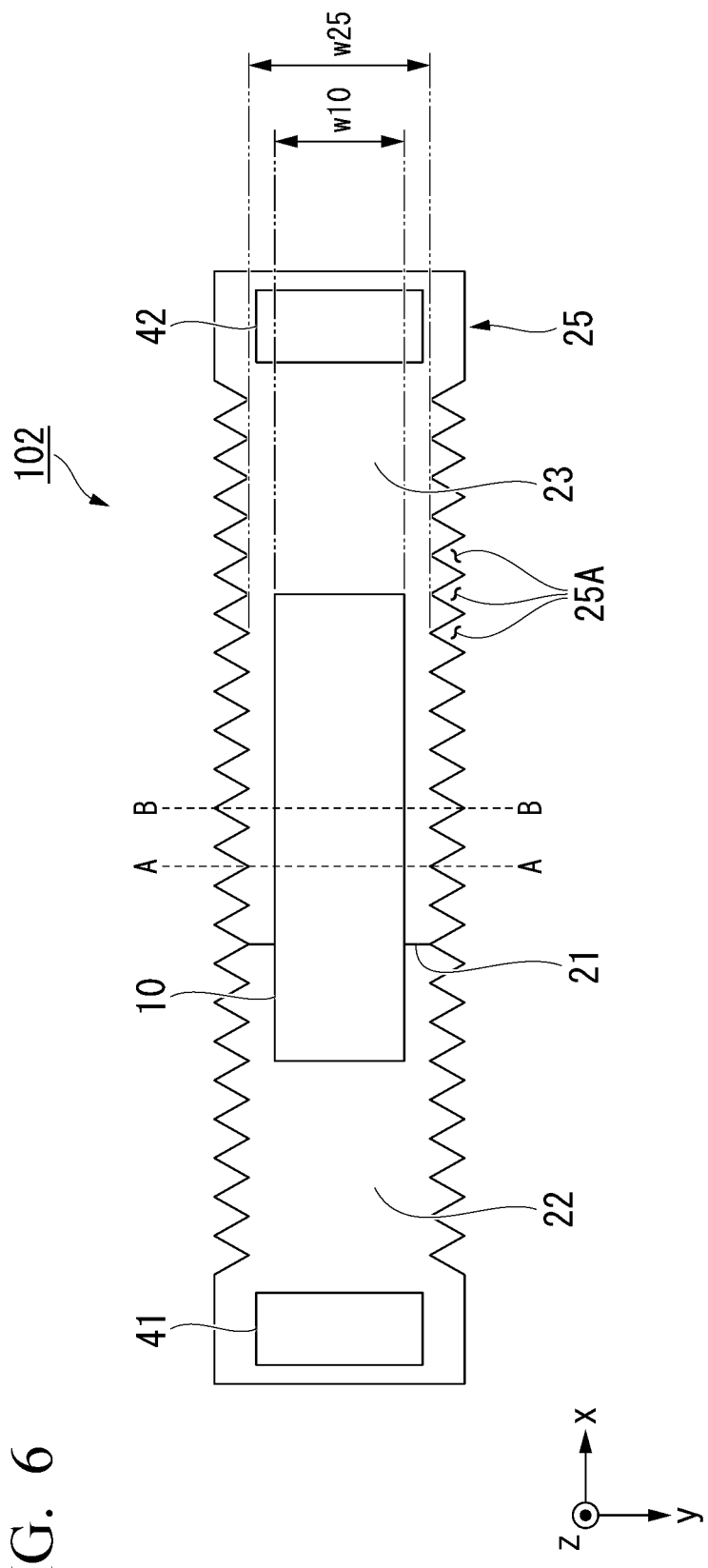
FIG. 6 is a plan view schematically illustrating a domain wall type magnetic recording element according to a third embodiment.

A domain wall type magnetic recording element 102 according to a third embodiment illustrated in FIG. 6 has the same shape as the domain wall type magnetic recording element 100 according to the first embodiment in a plan view from a z direction, but a cross-sectional shape of a magnetic recording layer 25 taken along a predetermined plane in a y direction is different from that of the domain wall type magnetic recording element 100 according to the first embodiment. Constituents the same as those in the domain wall type magnetic recording element 100 according to the first embodiment will be denoted by the same reference signs, and description thereof will be omitted.

The domain wall type magnetic recording element 102 according to the third embodiment illustrated in FIG. 6 includes a first ferromagnetic layer 10, a magnetic recording layer 25, and a nonmagnetic layer 30. The magnetic recording layer 25 has a plurality of recessed parts 25A on a side surface. Also, a width w10 of the first ferromagnetic layer 10 is smaller than a smallest width w25 of the magnetic recording layer 25 at any position in the y direction in a plan view from the z direction.

Figure 7:
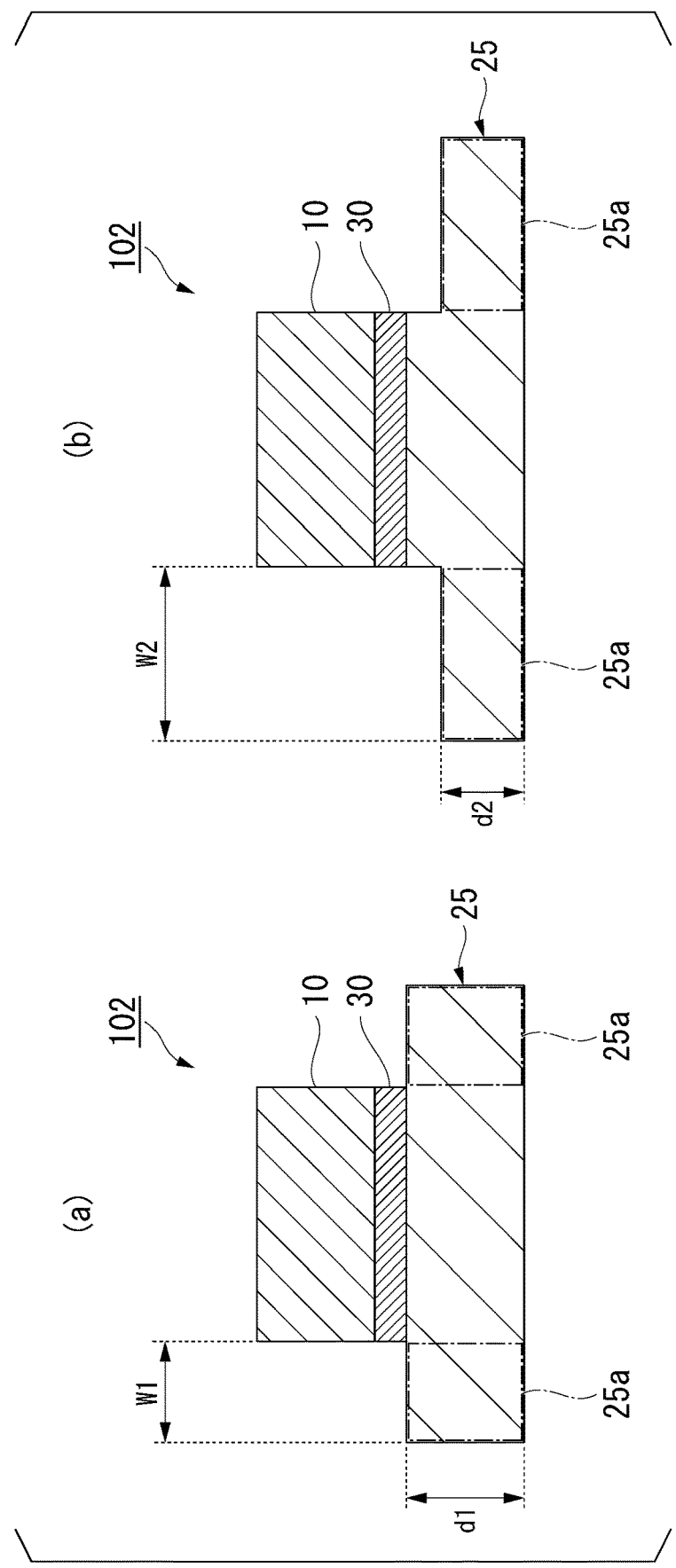
FIG. 7 is a cross-sectional view of the domain wall type magnetic recording element 102 according to the third embodiment taken along a y direction.

FIG. 7 is a cross-sectional view of the domain wall type magnetic recording element 102 according to the third embodiment taken along the y direction. FIG. 7(a) is a cross section taken along plane A-A, and FIG. 7(b) is a cross section taken along plane B-B. The plane A-A is an yz plane at a position at which a width in the y direction of the magnetic recording layer 25 is a smallest width w25, and the plane B-B is an yz plane at a position at which a width in the y direction of the magnetic recording layer 25 is a largest width.

As illustrated by the plane A-A in FIG. 7(a), a shape of a first portion 25a in which the magnetic recording layer 25 does not overlap the first ferromagnetic layer 10 in a plan view from the z direction is different depending on a cut surface. A width w1 of the first portion 25a (a closest distance between end portions of the first ferromagnetic layer 10 and the magnetic recording layer 25, see FIG. 7(a)) on a cut surface of the plane A-A is smaller than a width w2 of the first portion 25a (see FIG. 7(b)) on a cut surface of the plane B-B.

On the other hand, a thickness d1 of the first portion 25a on the cut surface of the plane A-A is larger than a thickness d2 of the first portion 25a on the cut surface of the plane B-B. With this configuration, a difference in area (|w1×d1− w2×d2|) of the first portion 25a for each cut surface can be reduced, and current density of a current flowing through the magnetic recording layer 25 can be made uniform. When the current density of the current flowing through the magnetic recording layer 25 is made uniform, an operation of the domain wall type magnetic recording element 102 is stabilized.

In FIG. 7, the difference in area of the first portion 25a for each cut surface is reduced by changing the thickness of the first portion 25a on the cut surface, but the present invention is not limited thereto as long as the difference in area of the first portion 25a for each cut surface can be reduced.

Figure 8:
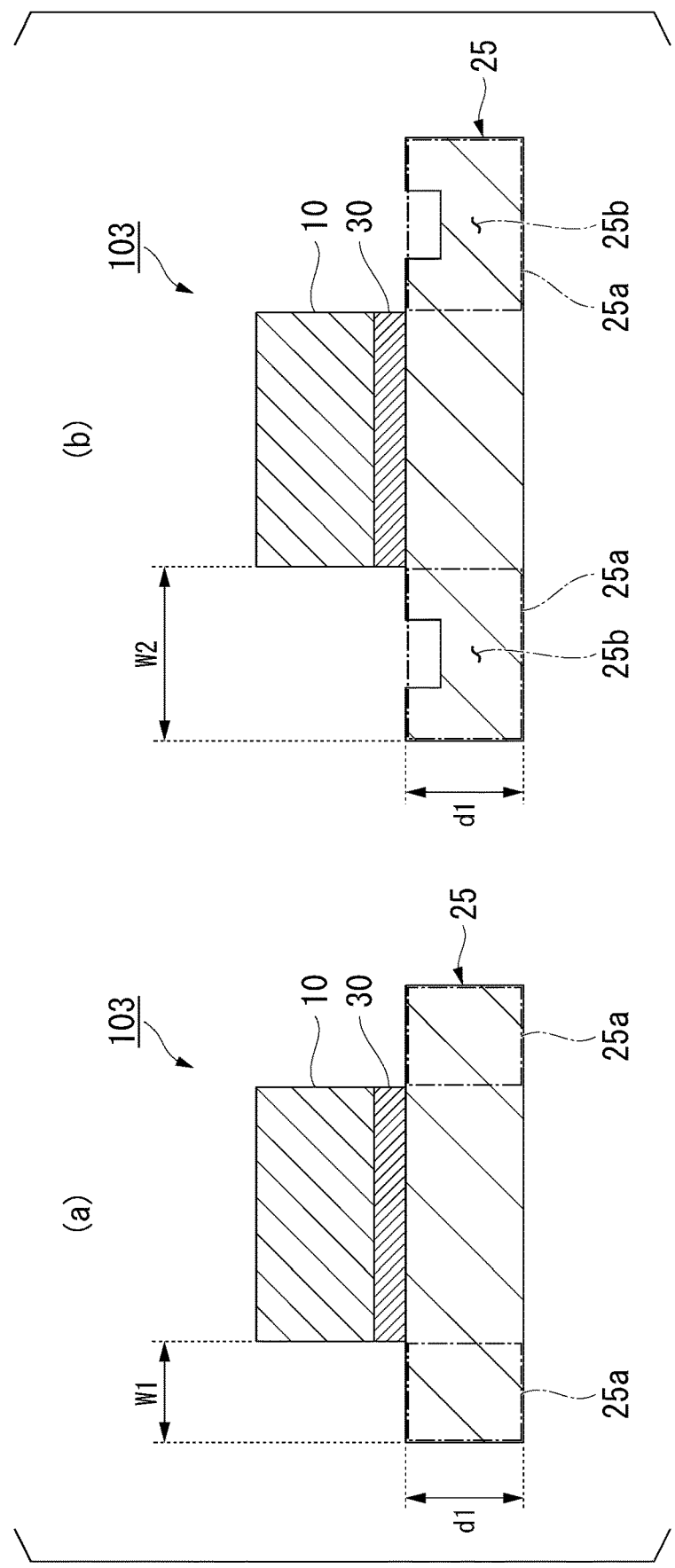
FIG. 8 is a cross-sectional view of another example of the domain wall type magnetic recording element according to the third embodiment taken along the y direction.

FIG. 8 is a cross-sectional view of another example of the domain wall type magnetic recording element according to the third embodiment taken along the y direction. FIG. 8(a) is a cross section taken along plane A-A, and FIG. 8(b) is a cross section taken along plane B-B. The plane A-A is an yz plane at a position at which a width in the y direction of the magnetic recording layer 25 is the smallest width w25, and the plane B-B is an yz plane at a position at which a width in the y direction of the magnetic recording layer 25 is the largest width.

The domain wall type magnetic recording element 103 illustrated in FIG. 8 has a thin part 25b in the first portion 25a at a position at which the width in the y direction of the magnetic recording layer 25 is the largest. When the thin part 25b is provided in the first portion 25a, a difference in area of the first portion 25a for each cut surface can be reduced, and non-uniform current density of a current flowing through the magnetic recording layer 25 can be inhibited.

Figure 9:
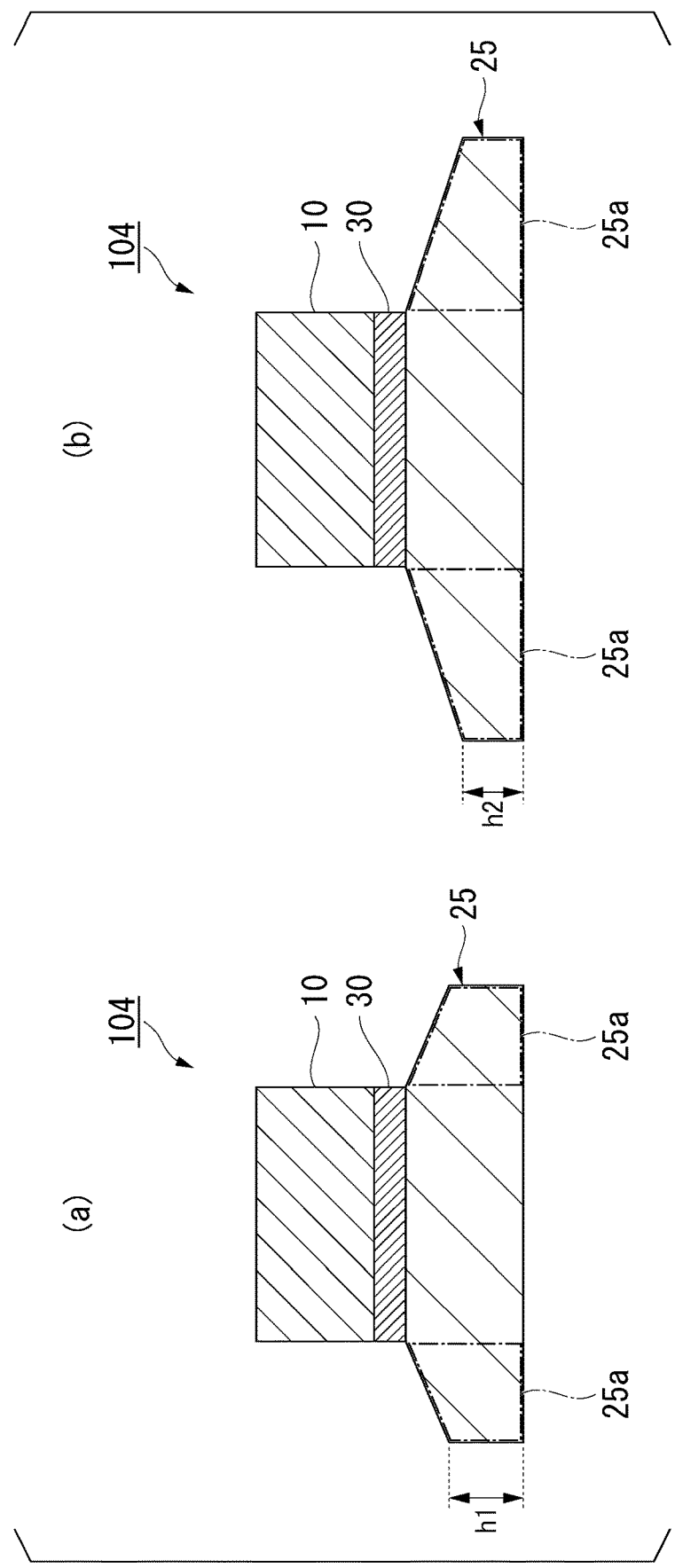
FIG. 9 is a cross-sectional view of another example of the domain wall type magnetic recording element according to the third embodiment taken along the y direction.

Also, FIG. 9 is a cross-sectional view of another example of the domain wall type magnetic recording element according to the third embodiment taken along the y direction. FIG. 9(a) is a cross section taken along plane A-A, and FIG. 9(b) is a cross section taken along plane B-B. The plane A-A is an yz plane at a position at which a width in the y direction of the magnetic recording layer 25 is the smallest width w25, and the plane B-B is an yz plane at a position at which a width in the y direction of the magnetic recording layer 25 is the largest width.

In a domain wall type magnetic recording element 104 illustrated in FIG. 9, an upper surface of the first portion 25a is an inclined surface. A height h1 of an end portion in the y direction of the first portion 25a in a cross section taken along plane A-A is larger than a height h2 of an end portion in the y direction of the first portion 25a in the cross section taken along plane B-B. Therefore, a difference in area of the first portion 25a between each of the cut surfaces is small. With this configuration, non-uniform current density of the current flowing through the magnetic recording layer 25 can be inhibited.

As described above, in the domain wall type magnetic recording elements 102, 103, and 104 according to the third embodiment, the width w10 of the first ferromagnetic layer 10 is smaller than the smallest width w25 of the magnetic recording layer 25 in the y direction. Therefore, generation of noise can be inhibited also in the domain wall type magnetic recording elements 102, 103, and 104 according to the third embodiment. Also, a difference in area of the first portion 25a for each cut surface can be reduced, and non-uniform current density of the current flowing through the magnetic recording layer 25 can be inhibited.

Fourth Embodiment

Figure 10:
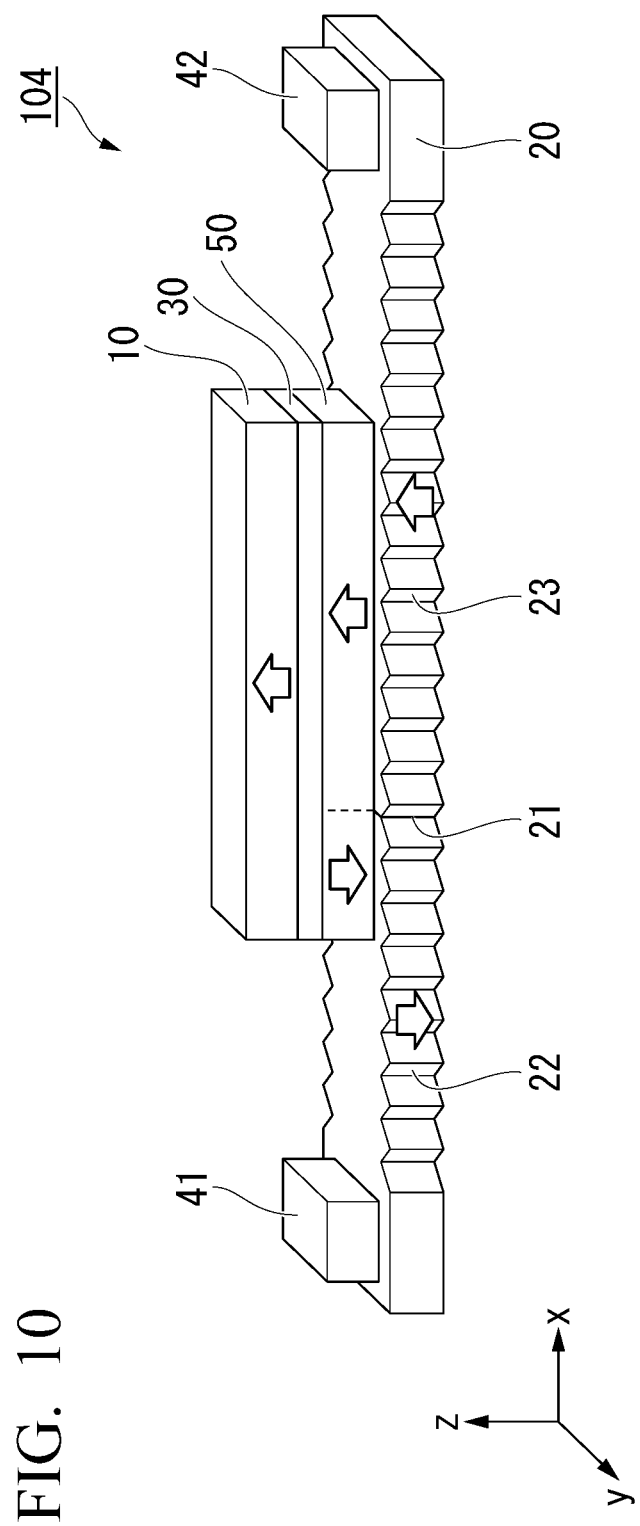
FIG. 10 is a schematic perspective view of a domain wall type magnetic recording element according to a fourth embodiment.

FIG. 10 is a schematic perspective view of the domain wall type magnetic recording element 105 according to a fourth embodiment. The domain wall type magnetic recording element 105 illustrated in FIG. 10 is different from the domain wall type magnetic recording element 100 according to the first embodiment in that a second ferromagnetic layer 50 is provided between a magnetic recording layer 20 and a nonmagnetic layer 30. Constituents the same as those in the domain wall type magnetic recording element 100 according to the first embodiment will be denoted by the same reference signs, and description thereof will be omitted.

The second ferromagnetic layer 50 contains a magnetic material. The same magnetic material as that of a first ferromagnetic layer 10 can be used as the magnetic material constituting the second ferromagnetic layer 50.

The second ferromagnetic layer 50 is adjacent to the magnetic recording layer 20. A magnetization of the second ferromagnetic layer 50 is magnetically coupled to a magnetization of the magnetic recording layer 20. Therefore, the second ferromagnetic layer 50 reflects a magnetic state of the magnetic recording layer 20. When the second ferromagnetic layer 50 and the magnetic recording layer 20 are ferromagnetically coupled, a magnetic state of the second ferromagnetic layer 50 is the same as a magnetic state of the magnetic recording layer 20, and when the second ferromagnetic layer 50 and the magnetic recording layer 20 are antiferromagnetically coupled, the magnetic state of the second ferromagnetic layer 50 is opposite to the magnetic state of the magnetic recording layer 20.

When the second ferromagnetic layer 50 is inserted between the magnetic recording layer 20 and the nonmagnetic layer 30, functions exhibited in the domain wall type magnetic recording element 105 can be divided between the second ferromagnetic layer 50 and the magnetic recording layer 20. An MR ratio of the domain wall type magnetic recording element 105 is generated by a change in magnetization state of two magnetic materials (the first ferromagnetic layer 10 and the second ferromagnetic layer 50) sandwiching the nonmagnetic layer 30. Therefore, a function of improving the MR ratio can be mainly assigned to the second ferromagnetic layer 50, and a function of displacing a magnetic domain wall 21 can be mainly assigned to the magnetic recording layer 20.

When the functions are divided between the second ferromagnetic layer 50 and the magnetic recording layer 20, a degree of freedom in magnetic materials constituting the respective layers increases. A material capable of obtaining a coherent tunneling effect with the first ferromagnetic layer 10 can be selected for the second ferromagnetic layer 50, and a material that makes a displacement speed of the magnetic domain wall slow can be selected for the magnetic recording layer 20.

As described above, also in the domain wall type magnetic recording element 105 according to the fourth embodiment, a width w10 of the first ferromagnetic layer 10 is smaller than a smallest width w25 of the magnetic recording layer 20 in the y direction. Therefore, generation of noise can be inhibited also in the domain wall type magnetic recording elements 105 according to the fourth embodiment. Also, when the second ferromagnetic layer 50 is inserted, a degree of freedom in selecting materials used for these layers can be increased. Also, when the degree of freedom in selecting materials increases, an MR ratio of the domain wall type magnetic recording elements 105 can be further increased.

As described above, although the domain wall type magnetic recording elements according to the first to fourth embodiments have been described in detail with reference to the accompanying drawings, the respective configurations, combinations thereof, or the like in the respective embodiments are merely examples, and additions, omissions, substitutions, and other modifications to the configurations are possible without departing from the gist of the present invention.

Figure 11:
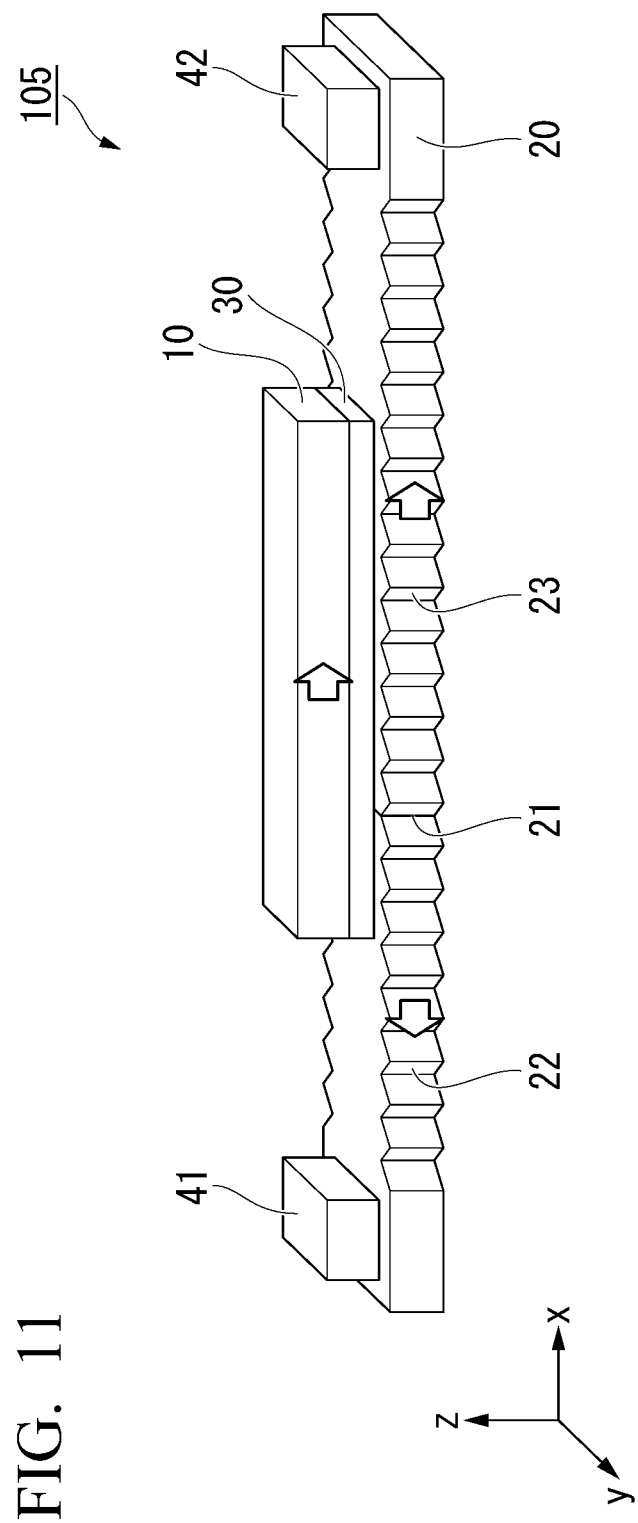
FIG. 11 is a perspective view schematically illustrating a domain wall type magnetic recording element in which axes of easy magnetization of a first ferromagnetic layer and a magnetic recording layer are in an in-plane direction perpendicular to a z direction.

For example, in the above-described embodiment, a case of the perpendicular magnetization film of which the axes of easy magnetization of the first ferromagnetic layer and the magnetic recording layer are in the z direction has been described as an example; however, as in a domain wall type magnetic recording element 106 illustrated in FIG. 11, an in-plane magnetization film of which axes of easy magnetization of the first ferromagnetic layer 10 and the magnetic recording layer 20 are in an in-plane direction perpendicular to the z direction may be used.

Also, for example, in the above-described embodiments, the widths in the y direction of the first ferromagnetic layer, the nonmagnetic layer, the second ferromagnetic layer, and the magnetic recording layer are made constant in the thickness direction, but these widths do not have to be constant. For example, a cut surface taken along the yz plane may be a trapezoidal shape.

Fifth Embodiment

Figure 12:
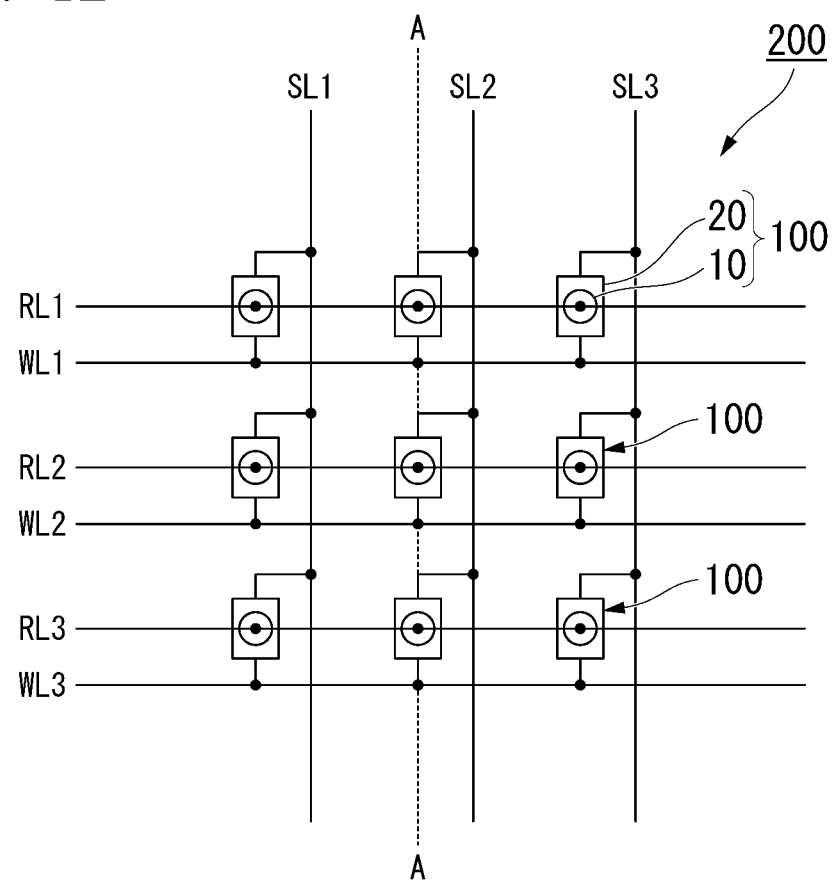
FIG. 12 is a plan view of a magnetic recording array according to a fifth embodiment.

FIG. 12 is a plan view of a magnetic recording array 200 according to a fifth embodiment. In the magnetic recording array 200 illustrated in FIG. 12, domain wall type magnetic recording elements 100 are disposed in a 3×3 matrix. FIG. 12 is an example of the magnetic recording array, and types, the number, and disposition of the domain wall type magnetic recording elements 100 are arbitrary.

One of word lines WL1 to WL3, one of source lines SL1 to SL3, and one of read lines RL1 to RL3 are connected to each of the domain wall type magnetic recording elements 100.

When the word lines WL1 to WL3 and the source lines SL1 to SL3 to which a current is applied are selected, a pulse current is caused to flow through the magnetic recording layer 20 of an arbitrary domain wall type magnetic recording element 100 and thus a write operation is performed. Also, when the read lines RL1 to RL3 and the source lines SL1 to SL3 to which a current is applied are selected, a current is caused to flow in a lamination direction of an arbitrary domain wall type magnetic recording element 100 and thus a read operation is performed. The word lines WL1 to WL3, the source lines SL1 to SL3, and the read lines RL1 to RL3 to which current is applied can be selected by transistors or the like. By recording data in a plurality of domain wall type magnetic recording elements 100 each capable of recording multivalued information, an increase in capacity of the magnetic recording array can be realized.

While preferred embodiments of the present invention have been described above, the present invention is not limited to such specific embodiments, and various modifications and changes can be made within the gist of the present invention described in the claim.

REFERENCE SIGNS LIST 10, 11 First ferromagnetic layer
20, 25 Magnetic recording layer
11A, 20A, 25A Recessed part
25a First portion
25b Thin part
21 Magnetic domain wall
22 First magnetic domain
23 Second magnetic domain
30 Nonmagnetic layer
41 First electrode
42 Second electrode
50 Second ferromagnetic layer
100, 101, 102, 103, 104, 105 Domain wall type magnetic recording element
200 Magnetic recording array

The invention claimed is:

1. A domain wall type magnetic recording element comprising:
   a first ferromagnetic layer containing a ferromagnetic material, the first ferromagnetic layer including a recessed part or a protruding part on a side surface thereof;
   a magnetic recording layer extending in a first direction which intersects a lamination direction of the first ferromagnetic layer and containing a magnetic domain wall, the magnetic recording layer including a recessed part or a protruding part, which is configured to trap the magnetic domain wall, on a side surface thereof; and
   a nonmagnetic layer sandwiched between the first ferromagnetic layer and the magnetic recording layer, wherein
   a width of the first ferromagnetic layer is smaller than a smallest width of the magnetic recording layer in a second direction perpendicular to the first direction in a plan view from the lamination direction.

2. The domain wall type magnetic recording element according to claim 1, wherein a shape of the first ferromagnetic layer in the plan view from the lamination direction is rectangular.

3. The domain wall type magnetic recording element according to claim 1, wherein a position of the recessed part or the protruding part of the magnetic recording layer in the first direction aligns with a position of the recessed part or the protruding part of the first ferromagnetic layer in the first direction.

4. The domain wall type magnetic recording element according to claim 3, wherein a first side in the first direction of the magnetic recording layer and a second side in the first direction of the first ferromagnetic layer closest to the first side are parallel to each other in the plan view from the lamination direction.

5. The domain wall type magnetic recording element according to claim 1, wherein
a first portion of the magnetic recording layer which does not overlap the first ferromagnetic layer in the plan view from the lamination direction includes a thin part having a thickness smaller than a thickness in the lamination direction of the magnetic recording layer at a position of the smallest width of the magnetic recording layer in the second direction, and
the thin part is at a position of a largest width of the magnetic recording layer in the second direction.

6. The domain wall type magnetic recording element according to claim 1, wherein, in a first portion of the magnetic recording layer which does not overlap the first ferromagnetic layer in the plan view from the lamination direction, a thickness d1 in the lamination direction at a position of the smallest width of the magnetic recording layer in the second direction is larger than a thickness d2 in the lamination direction at a position of a largest width of the magnetic recording layer in the second direction.

7. The domain wall type magnetic recording element according to claim 1, wherein axes of easy magnetization of the first ferromagnetic layer and the magnetic recording layer are in the lamination direction.

8. The domain wall type magnetic recording element according to claim 1, wherein axes of easy magnetization of the first ferromagnetic layer and the magnetic recording layer are in an in-plane direction perpendicular to the lamination direction.

9. The domain wall type magnetic recording element according to claim 1, wherein a number of recessed parts or protruding parts on the side surface of the magnetic recording layer is 10 or more.

10. The domain wall type magnetic recording element according to claim 1, further comprising:
a second ferromagnetic layer reflecting a magnetization state of the magnetic recording layer provided between the magnetic recording layer and the nonmagnetic layer.

11. A magnetic recording array comprising a plurality of domain wall type magnetic recording elements according to claim 1.

* * * * *